(12) United States Patent
Sakata et al.

(10) Patent No.: US 6,987,785 B2
(45) Date of Patent: Jan. 17, 2006

(54) HARMONIC GENERATOR, METHOD FOR DRIVING HARMONIC GENERATOR, IMAGE-DISPLAYING APPARATUS, IMAGE-FORMING APPARATUS, OPTICAL STORAGE APPARATUS THAT EMPLOYS HARMONIC GENERATOR

(75) Inventors: Hajime Sakata, Kanagawa (JP); Yukio Furukawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 379 days.

(21) Appl. No.: 10/404,057

(22) Filed: Apr. 2, 2003

(65) Prior Publication Data

US 2003/0210716 A1    Nov. 13, 2003

(30) Foreign Application Priority Data

Apr. 4, 2002    (JP)    ............................. 2002-102702

(51) Int. Cl.
*H01S 3/10*    (2006.01)
(52) U.S. Cl. ...................................................... 372/22
(58) Field of Classification Search ................. 372/22, 372/21
See application file for complete search history.

(56) References Cited

U.S. PATENT DOCUMENTS

| 5,168,503 | A | * | 12/1992 | Maeda | ......................... 372/22 |
| 5,410,561 | A | * | 4/1995 | Ogawa | ........................ 372/22 |
| 5,452,312 | A | * | 9/1995 | Yamamoto et al. | ............ 372/5 |
| 5,936,985 | A | * | 8/1999 | Yamamoto et al. | ........... 372/31 |
| 6,678,306 | B1 | * | 1/2004 | Sonoda | ......................... 372/96 |
| 2001/0005388 | A1 | * | 6/2001 | Hirata et al. | .................. 372/22 |
| 2001/0019563 | A1 | * | 9/2001 | Hatori | ......................... 372/21 |
| 2002/0130329 | A1 | | 9/2002 | Furukawa | ..................... 257/98 |

FOREIGN PATENT DOCUMENTS

JP    11-232680    8/1999

* cited by examiner

*Primary Examiner*—Minsun O. Harvey
*Assistant Examiner*—James Menefee
(74) *Attorney, Agent, or Firm*—Fitzpatrick, Cella, Harper & Scinto

(57) ABSTRACT

There is provided a harmonic generator generates high power laser light and can be modulated at high modulation rate. The semiconductor laser emits a first output light when a bias current is supplied, and a second output light when a modulating current is superposed to the bias current. On of the first output lights has a wavelength inside of a wavelength tolerance of phase-matching of the wavelength-converting element. The other has a wavelength outside of the wavelength tolerance of phase-matching.

1 Claim, 8 Drawing Sheets

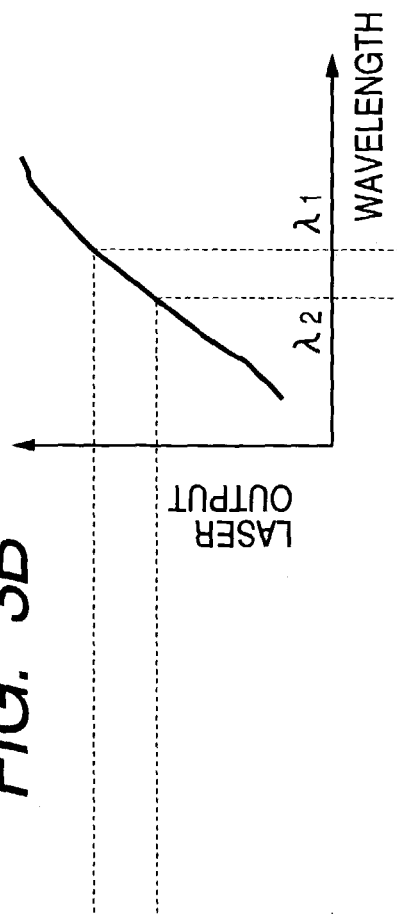
FIG. 3A
FIG. 3B
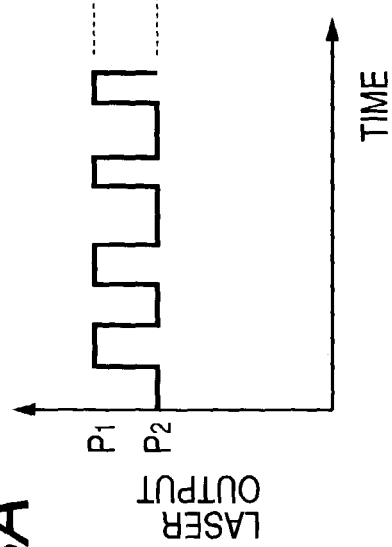
FIG. 3D
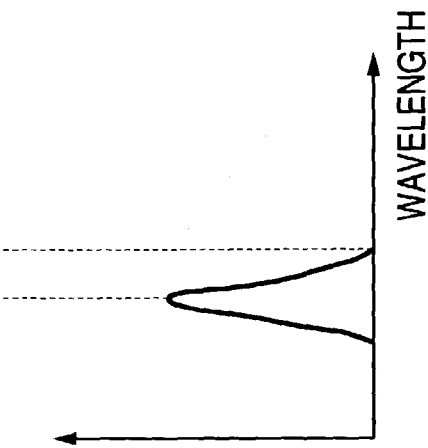
FIG. 3C

HARMONIC GENERATOR, METHOD FOR DRIVING HARMONIC GENERATOR, IMAGE-DISPLAYING APPARATUS, IMAGE-FORMING APPARATUS, OPTICAL STORAGE APPARATUS THAT EMPLOYS HARMONIC GENERATOR

BACKGROUND OF THE INVENTION

1. Field of the Invention

The present invention relates to a miniaturized harmonic generator that can be modulated, the light source being useful in image display, image formation, optical information processing, optical recording, and optical instrumentation.

2. Related Background Art

A miniaturized visible laser-light source (wavelengths in the range of 400 to 700 nm) that can be modulated is a promising light source and will find its wide applications in the fields of display, digital photo printer, laser beam printer, optical memory, laser machine, and laser therapy equipment and other fields such as information processing, instrumentation, medical service, and biotechnology. A semiconductor laser is small and can be modulated at a high rate. However, in the range of visible wavelengths, only limited semiconductor lasers are reliable and currently in practical use. They are a red laser in the range of 630 to 700 nm, and purple and blue lasers in the range of 400 to 460 nm. This depends on the development of compound semiconductor materials that constitute a semiconductor laser. There are many problems that must be overcome before semiconductor lasers in the range of wavelengths between blue and red, i.e., blue-green, green, yellow-green, yellow, and orange can be practically applied.

A conventional miniaturized laser in the green region is a wavelength conversion laser in which a semiconductor laser of 808 nm is used as a pumping light to cause a solid-state laser made of Nd:YAG crystal or Nd:YVO$_4$ crystal to oscillate and the second harmonic of the oscillation is used. Solid-state lasers such as Nd:YAG and Nd:YVO$_4$ have a wavelength of 1064 nm. A non-linear crystal is used to convert the oscillated light into the second harmonic, i.e., green light having a wavelength of 532 nm. However, with the configuration in which a solid-state laser generates light having a fundamental-wavelength, the modulation rate of the laser light is limited by the lifetime of fluorescence of the solid-state crystal. For example, because the lifetime of fluorescence is 230 μsec for Nd:YAG crystal and 90 μsec for Nd:YVO$_4$ crystal, the modulation rate is only several tens kHz at the highest. For higher modulation rates, an external light modulator based on acoustooptic effect or electrooptical effect is required at the output of the wavelength conversion laser. The provision of an external light modulator has problems that (1) the overall size and complexity of the apparatus increase, (2) energy efficiency decreases due to transmission of light through an external light modulator, and (3) driving a light modulator necessitates additional power consumption.

In order to solve this problem, "OPTRONICS" on pages 89–93, January, 2000 proposes a configuration in which semiconductor laser light is introduced into a non-linear crystal device to directly convert the wavelength. With the configuration described in "OPTRONICS", periodical domain inversion is formed in a non-linear optical crystal to increase effective non-linear optical constant. Additionally, an optical waveguide can be used to increase power density of a fundamental wavelength. Thus, wavelength conversion efficiency is improved. However, quasi phase-matching based on domain inversion has a wavelength tolerance of 0.1 nm with respect to the fundamental wave. In order to couple laser light into an optical waveguide, the laser light needs to be focused into a small beam diameter. To meet these requirements, the wavelength and mode of oscillation in the semiconductor laser need to be stabilized during modulation. Semiconductor lasers used in the field of optical communications use a grating in the form of an optical waveguide to lock wavelength. Such semiconductor lasers are a distributed Bragg reflector laser and a distributed feedback laser. These lasers meet these requirements as a semiconductor laser used in the field of optical communication. Specifically, these semiconductor lasers include InGaAsP/InP semiconductor lasers of 1300 nm and 1550 nm and AlGaAs/GaAs semiconductor lasers of 850 nm. In other words, direct wavelength conversion of ½-wavelengths of these wavelengths can be easily accomplished and therefore modulating the fundamental wavelengths will modulate the second harmonics of the fundamental wavelengths.

However, the second harmonics in the aforementioned wavelengths of optical communications have about 430 nm, 650 nm, and 780 nm, lacking wavelengths between blue light and red light. Light in the middle of the range of visible laser (i.e., from blue-green to orange) is obtained from fundamental wavelengths from 980 nm to 1200 nm. Typical semiconductor lasers that oscillate at wavelengths from about 980 nm to 1200 NM are those that employ a strained quantum well of InGaAs as an active region. It should be noted that GaAs as a laser substrate is transparent in these wavelengths and therefore the light is reflected between an n-electrode and a p-electrode a plurality of times through the cap layer and the substrate. This causes mode hopping and multiple peaks in the oscillated spectrum. Generally, in order to obtain a high-power second harmonic, a high-power semiconductor laser is required. However, modulating a semiconductor laser with a large current will result in large fluctuations of oscillation wavelength and oscillation mode, so that wavelength conversion efficiency is not stable. Thus, it is difficult to increase modulation rate. As shown in FIGS. 8A and 8B, Japanese Patent Application Laid-Open No. 11-232680 discloses modulation in which the intensity of light is modulated so that the fluctuation of average output power of a semiconductor laser is within ±20% and the oscillation wavelength is always in an allowable range of phase-matching wavelengths, i.e. a range of wavelengths allowable as wavelength fulfilling the pulse-matching condition.

However, with the aforementioned conventional art, the average output of a semiconductor laser is controlled within a predetermined range and therefore the second harmonic output (e.g., blue output in FIGS. 8A and 8B) is always present within the wavelength tolerance of phase matching. This implies that extinction ratio cannot be large in amplitude modulation. For this reason, for the applications in image displaying apparatus and image forming apparatus, contrast ratio and gradation are considerably limited. For pulse width modulation and pulse number modulation, a output light exists between pulses, requiring some measure for increasing signal-to-noise ratio. Further, when laser safety class is is to be calculated, pulses cannot be treated as typical pulses trains that are completely separated from each other. Thus, a problem is that this imposes a barrier on correct safety classification.

SUMMARY OF THE INVENTION

According to an aspect of the present invention, there is provided a harmonic generator comprising a semiconductor laser and a wavelength-converting element comprised of a nonlinear optical material that converts a wavelength of a output light emitted by the semiconductor laser into a harmonic, wherein the semiconductor laser emits a first output light when a bias current is supplied and a second output light when a modulating current is superposed to the bias current, the first output light and the second output light are different from each other in wavelength;

wherein one of wavelengths of the first output light and the second output light is in an allowable range of phase-matching wavelengths of the wavelength-converting element and the other is out of the allowable range.

According to another aspect of the present invention, there is provided a method for driving a harmonic generator in which an output light of a semiconductor laser is incident on a wavelength-converting element comprised of a non-linear optical material to generate a harmonic, comprising the steps of:

supplying to a semiconductor laser a driving current comprised of a bias current and a modulating current superposed on the bias current so that an output light of the semiconductor laser is modulated, wherein an oscillation wavelength of the output light of the semiconductor laser is out of an allowable range of phase-matching wavelengths when only the bias current is supplied, and is in the allowable range when both of the bias current and the modulating current are supplied.

According to still another aspect of the present invention, there is provided a method for driving a harmonic generator in which an output light of a semiconductor laser is incident on a wavelength-converting element comprised of a non-linear optical material to generate a harmonic, comprising the steps of:

supplying to a semiconductor laser a driving current comprised of a bias current and a modulating current superposed on the bias current so that an output light of the semiconductor laser is modulated, wherein an oscillation wavelength of the output light of the semiconductor laser is in an allowable range of phase-matching wavelengths when only the bias current is supplied, and is out of the allowable range when both of the bias current and the modulating current are supplied.

According to a further aspect of the present invention, there is provided an image displaying apparatus comprising the above harmonic generator.

According to a further aspect of the present invention, there is provided an image forming apparatus comprising the above harmonic generator.

According to a further aspect of the present invention, there is provided an optical recording apparatus comprising the above harmonic generator.

The harmonic may have a light power having a modulation waveform and an amplitude that varies from zero to a predetermined value.

The non-linear optical material may be a ferroelectric crystal that performs wave conversion using birefringent phase matching.

The non-linear optical material may be a non-linear optical material obtained by polarizing a glass material.

The non-linear optical material may be an organic material.

The non-linear optical material may have a periodically poled construction.

The non-linear optical material may have an optical resonator construction.

The wavelength-converting element may be comprised of an optical waveguide comprised of a non-linear optical material.

The semiconductor laser may generate light at the range of 980 to 1200 nm wavelength. In addition, this semiconductor laser may include an active region having an InGaAs strained quantum well or an active region having a GaInNAs compound semiconductor, or an active region having a GaAsSb compound semiconductor.

The semiconductor laser may include an active region having an AlGaAs compound semiconductor.

The semiconductor laser may be a Fabry-Perot type semiconductor laser which has a light-emitting surface that serves as a resonator mirror.

The semiconductor laser may be either a distributed Bragg reflection semiconductor laser or a distributed feedback semiconductor laser which have a waveguide grating as a resonator mirror.

BRIEF DESCRIPTION OF THE DRAWINGS

FIGS. 3A, 3B, 3C and 3D illustrate the principle of operation of the present invention;

DESCRIPTION OF THE PREFERRED EMBODIMENTS

It is known that the wavelength of output light of a semiconductor laser changes in accordance with increase and decrease of the injected current. It is known that the change of wavelength results from heat, carrier effects, and combinations of these, depending on the material of a semiconductor laser, the structure of a laser oscillator, and the manner in which the laser oscillator is mounted. For example, due to the plasma effect of carriers, a wavelength of laser light to be oscillated by InP semiconductor laser shifts to a shorter oscillation wavelength with increasing injection current. A wavelength of laser light to be oscillated by GaAs high power laser, which is usually sensitive to heat, shifts to a longer oscillation wavelength as the injection current increases. Thus, when a modulating current has been superposed to a bias current since the start of the bias current flow, the wavelength of output light of the semiconductor laser changes in accordance with the modulating current.

A wavelength of the fundamental wave capable of being converted into a harmonic by a wavelength-converting element must be in a limited range. If the wavelength is out of the range, the harmonic does not generate. On the basis of this fact, a harmonic generator is designed for that in which a wavelength of the oscillated light is out of the allowable range of phase-matching wavelengths when a bias current is applied to a semiconductor laser and the wavelength shifts to the inside of the range when a modulating current is applied to the semiconductor laser in addition to the bias current. In other words, a change in the ocsillation wavelength caused by a small change in output from the semiconductor laser according to the modulating current realize the great change in a harmonic output.

The modulation of semiconductor laser light in the present invention is performed by the modulation current added to the bias current, which makes it possible to carry out a high speed modulation regarding the harmonic output by controlling only a modulating current of a small amplitude.

Figure 1:
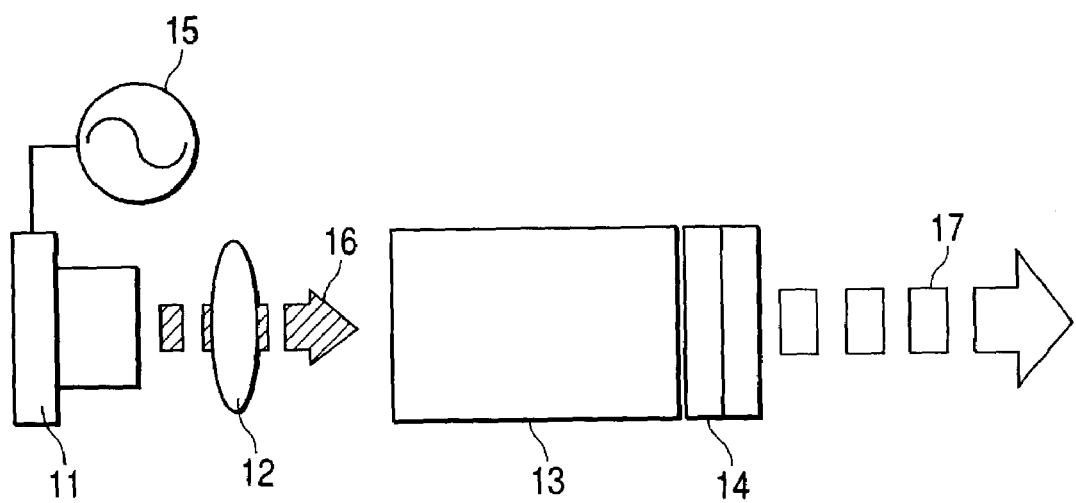
FIG. 1 illustrates a basic configuration of the present invention.
Figure 2B:
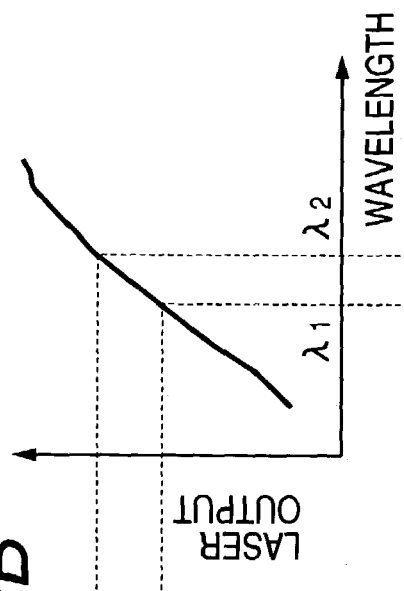
FIGS. 2A, 2B, 2C and 2D illustrate the principle of operation of the present invention.
Figure 2C:
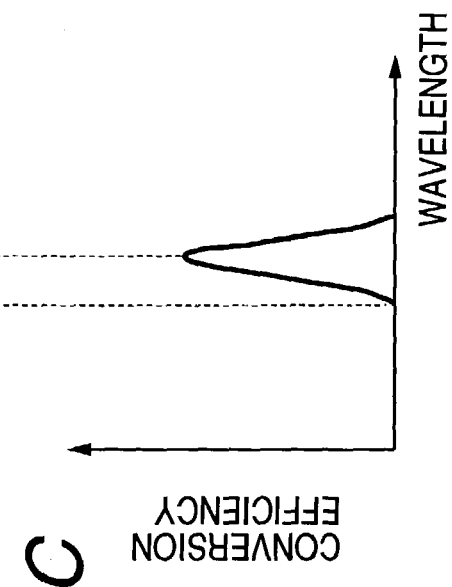
Figure 2A:
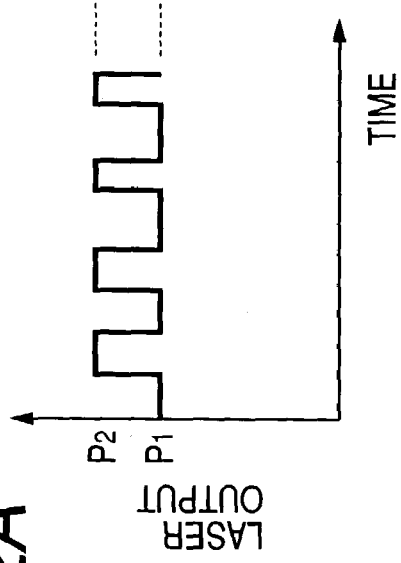
Figure 2D:
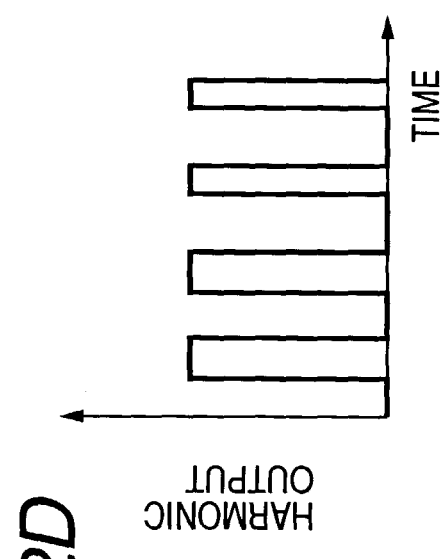

FIG. 1 illustrates a basic configuration of a harmonic generator according to the invention. Reference numerals 11, 12, 13, and 14 denote a semiconductor laser as a fundamental wave light source, a condenser lens, a wavelength-converting element, and a fundamental wave cutting filter that cuts the fundamental wavelength, respectively. Reference numerals 15, 16, and 17 denote a drive source that supplies a current to the semiconductor laser 11, a modulated fundamental wave, and modulated harmonic light, respectively. FIGS. 2A to 2D illustrate best the operating principle of the present invention. For convenience's sake, GaAs material is used as a wavelength-converting element. FIG. 2A illustrates a waveform of a output light of a semiconductor laser with time. FIG. 2B illustrates the relation between a semiconductor laser output and oscillation wave. FIG. 2C illustrates the wavelength of light incident on a wavelength-converting element versus conversion efficiency when a harmonic wavelength is produced. FIG. 2D illustrates the waveform of a harmonic output light with time.

In this specification, the terms "fundamental wave" and "oscillation wavelength" will be used hereinafter. The term "fundamental wave" is used to cover light of the laser incident on a wave-converting element and the term "oscillation wavelength" is used to cover the wavelength of the laser output. However, it should be noted that these two terms refer to essentially the same physical means in the present invention. As to the input and output of a wavelength-converting element, when light is incident on the wavelength-converting element, the light is termed a fundamental wave (i.e., a wavelength of the light is a fundamental wavelength.). When light is output from the wavelength-converting element, the light is termed a harmonic, which means a light comprised of harmonic ingredients (i.e., the light is a harmonic of the fundamental wave). In other words, the semiconductor laser is a light source that emits laser light having a certain oscillation wavelength, and the wavelength-converting element receives the oscillation wavelength as a fundamental wavelength.

A non-linear crystal can generate second harmonic, third harmonic and so on. The second harmonic is proportional to a square of the electric field and, is the most efficient. However, if a shorter wavelength is desired, the third harmonics may be used. Here, the present embodiment will be described with respect to the second harmonic as a typical example.

As described on page 210, "Solid-state laser" by Takao Kobayashi, published by Gakkai Shuppan Center, when a fundamental wave is converted into the second harmonic, the conversion efficiency $\eta_{SHG}$ of a wavelength-converting element is given by Equation (1):

$$\eta_{SHG} = 8\pi^2 \left(\frac{\mu_0}{\varepsilon_0}\right)^{1/2} \frac{d^2}{n^3} \left(\frac{1}{\lambda}\right) \frac{P^{(\omega)}}{A} \frac{\sin^2(\Delta k l/2)}{(\Delta k l/2)^2} \quad (1)$$

where $\mu_o$ and $\varepsilon_o$ are magnetic permeability and dielectric constant in space, respectively, d is an effective non-linear constant, l is a crystal length, n is a refractive index of a crystal, $\lambda$ is a wavelength of a fundamental wave, $P^{(\omega)}$ is the power of the fundamental wave, A is a beam area, and $\Delta k$ is a phase-unmatching rate. The last term $\sin^2(\Delta k l/2)/(\Delta k l/2)^2$ of Equation (1) gives a measure of wavelength tolerance of phase-matching. The conversion efficiency is substantially zero where $\Delta k l/2 = \pi$. Thus, change in oscillation wavelength is preferably designed so that the shift of wavelength causes $\Delta k l/2$ to be slightly more than 3. For example, for KTiOPO$_4$ (KTP) and LiNbO$_3$(LN), the oscillation wavelength can be shifted by about 1 to 2 nm from the center wavelength of phase-matching. Using the fact that second-harmonic light power becomes zero when $\Delta k l/2 = \pi$ is satisfied, a sufficient extinction ratio is obtained.

The semiconductor laser 11 to which the present invention is applied is selected as follows: When light in the range of blue-green to green (i.e., about 490 to 560 nm) is desired, then the oscillation wavelength is in the range of 980 to 1120 nm. If light in the range of yellow-green through yellow to orange (i.e., about 560 to 600 nm) is desired, the semiconductor laser 11 oscillates at a wavelength in the range of 1120 to 1200 nm. The output light of the semiconductor laser 11 is incident upon the wavelength-converting element through the condenser lens 12. The condenser lens 12 is used so that light power density in the wavelength-converting element 13 is increased to improve conversion efficiency.

The fundamental wave that transmits through a non-linear optical material is rejected by a fundamental wave cutting filter 14 that incorporates the infrared absorbing filter and the multiple layered interference filter placed together, so that only the second harmonic is obtained. A drive power supply 15 injects a drive current into the semiconductor laser 11, the drive current being obtained by superposing a modulating signal to a bias current. Then, as shown in FIG. 2A, the output $P_2$ of the semiconductor laser has a waveform on time axis in which an output power $P_1$ produced by a modulation signal is superposed to an output power $P_1$ produced by a bias current. Thus, as shown in FIG. 2B, when only a bias current is supplied to the semiconductor laser, the oscillation wavelength is $\lambda_1$, and when a modulation current is superposed to the bias current, the oscillation wavelength is $\lambda_2$. The conversion efficiency of the wavelength-converting element changes relative to the fundamental wave as shown in FIG. 2C. If the wave converting element is designed such that efficient wave conversion takes place at $\lambda_2$ and not at $\lambda_1$, the second harmonic output can be obtained with a pulse waveform in which the output light of the second harmonic rises from zero to a desired peak value and then falls to zero as shown in FIG. 2D. That is, the modulated waveform of the output of the semiconductor laser is a shape in which a modulation of a small-amplitude is superposed to a non-modulated output while the output light of the second harmonic has a pulse shape of a large-amplitude modulation. Injecting a drive current having a large amplitude into a semiconductor laser to modulate the output light of the semiconductor laser causes the carriers in the active region of the semiconductor laser to fluctuate and makes it difficult to follow a time-varying waveform at high speed. Moreover, it is also difficult for the driving power supply to controllably supply a large current that changes at high speed. In contrast, according to the present invention, supplying a bias current before a modulating current is supplied to the semiconductor laser minimizes carrier fluctuation in the active region and allows the driving power supply to operate at high speed.

An alternative way of obtaining the second harmonic is, as shown in FIG. 3A, to supply a bias current such that a laser output is $P_1$ when only a bias current is supplied and $P_2$ when a negative modulating current is added to the bias current. Thus, as shown in FIG. 3B, when only a bias current is supplied to the semiconductor laser, the oscillation wavelength is $\lambda_1$, and when a modulation current is superposed to the bias current, the oscillation wavelength is $\lambda_2$. The conversion efficiency of the wavelength-converting element varies relative to the fundamental wave as shown in FIG. 3C. If the wave converting element is designed such that efficient wave conversion takes place at $\lambda_2$ and not at $\lambda_1$, the second harmonic can be obtained with a pulse waveform in which the output light of the second harmonic rises from zero to a desired peak and then falls to zero as shown in FIG. 3D.

The harmonic generator has been described with respect to a case where the harmonics is not output when only a bias current is supplied. Conversely, the apparatus may be driven in such a way that when only a bias current is supplied, a continuous wave of the second harmonic is generated, and when a modulating current is superposed to the bias current, the modulated second harmonic is not output. Therefore, as shown in FIGS. 2A to 2C and FIGS. 3A to 3C, $\lambda_1$ is inside of a wavelength tolerance of phase-matching and $\lambda_2$ is outside of the wavelength tolerance of phase-matching.

First Embodiment

A first embodiment of the present invention will be described with reference to FIG. 1. A semiconductor laser 11 includes an active region of a quantum well structure in which InGaAs forms a well layer and InGaAsP forms a barrier. The InGaAs quantum well layer is subjected to compression strain, so that when the semiconductor laser 11 is driven with a driving current of 1A, the oscillation wave is centered at 1064 nm. The driving current of 1A produces a output light of about 600 mW. A bias current of about 800 mA will produce a output light of little less than 500 mW having a wavelength centered at 1061 nm. Superposing a modulating current of 200 mA to the bias current will shift the wavelength of the output light to 1064 nm, whereby a fundamental wave 16 responsive to pulse of the modulating current is obtained. Wavelength-converting element 13 is comprised of $KTiOPO_4$ crystal of 10 mm in length cut under the condition of phase-matching angles $\theta=90°$ (perpendicular to Z-axis as the major axis of the crystal) and $\phi=24.5$ (an angle with X-axis of the crystal in X-Y plane). The output light of the semiconductor laser beam is incident on the wavelength-converting element in such a way that the polarization plane of the semiconductor laser beam meets Type II phase-matching condition. Anti reflection coating (not shown) made of $TiO_2$ and $SiO_2$ has been applied to both end surfaces of the KTP so that reflection will not occur at 1064 nm and 532 nm. The output light is focused by condenser lens 12 so that the light incident on the crystal has a beam diameter of about 50 $\mu$m. Thus, the second harmonic having a wavelength of 532 nm and a pulsed power output of about 200 $\mu$W can be obtained. The repetitive frequency of the pulse is 500 MHz and the pulse waveform of the second harmonic is much the same as that of the fundamental wave modulated by the modulating signal. In order to improve a conversion efficiency for converting the fundamental wave into the second harmonic, the harmonic generator can be of optical resonator construction with the KTP sandwiched so that the light power density in the crystal increases to improve the conversion efficiency. The fundamental wave at 1064 nm that has be transmitted by the KTP is absorbed by an infrared absorbing filter, which is a part of the fundamental wave cutting filter 14, but is reflected by a multi layer interference filter, which is also a part of the fundamental wave cutting filter 14 and light to be reflected at which is centered at 532 nm. As a result, only the second harmonic centered at 532 nm is obtained.

Second Embodiment

In a second embodiment, a semiconductor laser has an active layer comprised of an InGaAs compressivelly strained quantum well and a GaAsP tensile strained barrier layer that alleviates compressive strain, and a clad layer comprised of AlGaAs. The semiconductor laser generates laser light at 1080 nm. The phase matching angle of the KTP at 1080 nm is $\theta=90°$ and $\phi=0°$. The phase-matching is not critical with respect to the angle $\phi$ and wavelength conversion efficiency is ensured over a large allowance of angle. The second embodiment is also characterized in that an effective non-linear constant is 3.64 pm/V, which is larger than 3.33 pm/V at 1064 nm. This crystal condition will not cause a so-called walk-off in which a wavelength shift occurs between the fundamental wave and harmonic. As a result, the KTP can have a length of 30 mm for high conversion efficiency. Superposing a modulating current of 250 mA to a bias current of 750 mA produces an output waveform as shown in FIG. 2A and the output of the second harmonic will be the pulse wave as shown in FIG. 2D due to a change in the oscillation wavelength. A pulsed output light of about 3 mW was obtained. The second harmonic is centered at 540 nm. When only a bias current is being supplied, no substantial wavelength conversion of the output of the laser takes place and therefore no second harmonic generates.

Third Embodiment

Figure 4:
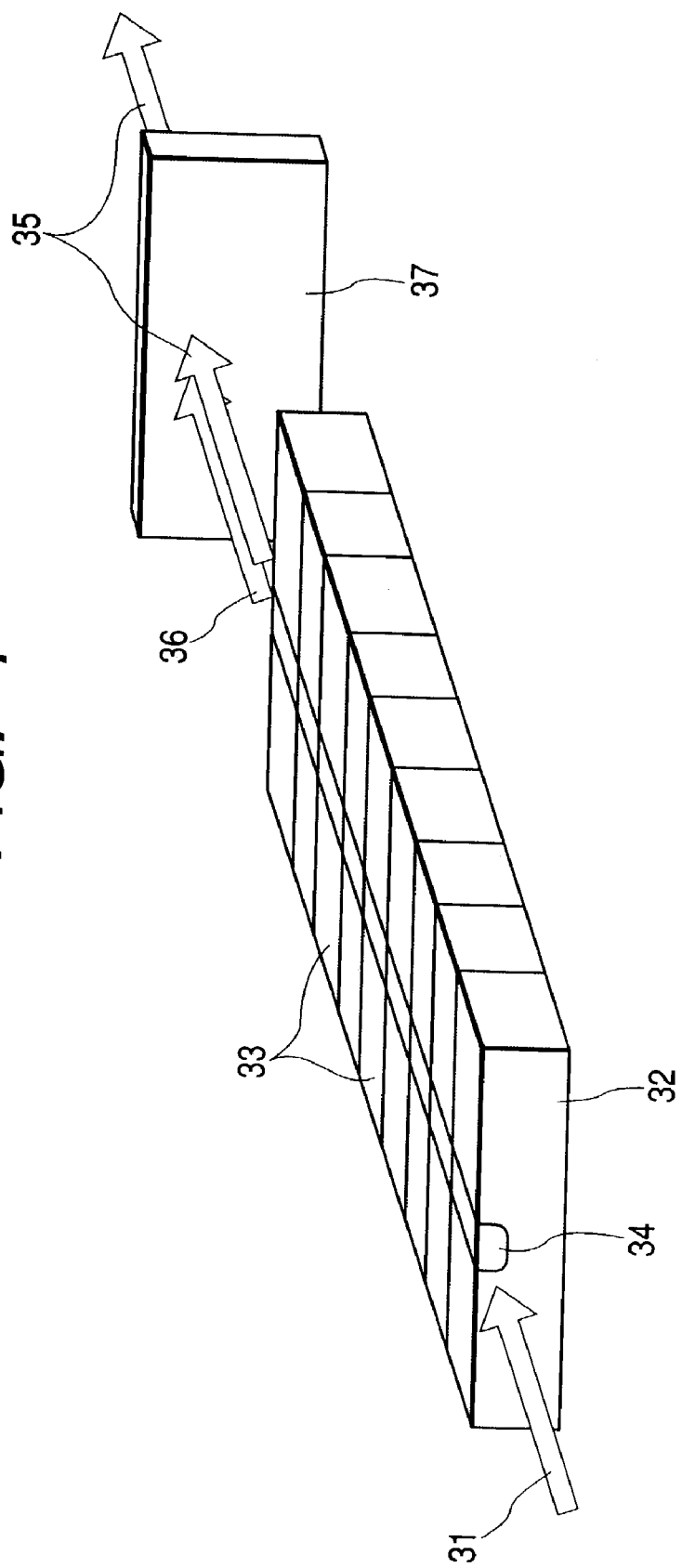
FIG. 4 illustrates a wavelength-converting element according to the embodiment of the invention.

A third embodiment uses $LiNbO_3$ (LN) as a wavelength converting element that is comprised of an optical waveguide. FIG. 4 is a schematic view of a wavelength-converting element according to the third embodiment. Reference numerals 31, 32, 33, and 34 denote a fundamental wave, a non-linear crystal substrate such as a Z-cut LN substrate, a periodically domain-inverted structure, and an optical waveguide, respectively. Reference numerals 35, 36, and 37 denote pulsed second harmonic, a fundamental wave, and a fundamental wave cutting filter, respectively. As shown in FIG. 4, in order to ensure quasi phase matching to the fundamental wave 31 of 1064 nm, grid-like electrodes at a pitch of 6.81 $\mu$m are formed on the Z-cut LN substrate 32 and a high electric field is applied to the electrodes, thereby forming the periodically domain-inverted structure 33. Moreover, the optical waveguide 34 having a width of 5 $\mu$m and a depth of 5 $\mu$m is formed by proton exchange to cross the domain inversion grids. The effect of increasing the light power density in the non-linear optical material is expressed by the term $P^{(\omega)}/A$ of Equation (1). This effect is very efficiently utilized by forming the optical waveguide in the non-linear optical material. The optical waveguide has a length of 20 mm and makes the polarization plane of the fundamental wave orthogonal to the substrate so that the fundamental wave is coupled . For a semiconductor laser input of 300 mW, the wavelength-converting element produces the second harmonic having a power of about 100 mW. The wavelength-converting element according to the embodiment that employs a quasi phase matching can accept about 0.2 nm at best as the wavelength error for a fundamental wave, which is narrow. When a semiconductor laser generates an output of 250 mW at a bias current and a modulation signal amplitude of 50 mW is input to the semiconductor laser, the wavelength-converting produces a second harmonic 35 with a desired pulse-modulation. The response property of pulse is 1 ns at both leading and trailing. The use of $KNbO_3$(KN) as the wavelength-converting element offers similar characteristics. The fundamental wave cutting filter 37 rejects fundamental wave 36 having passed through the optical waveguide and passes pulses 35 consisting of only the second harmonic component.

Fourth embodiment

A fourth embodiment uses a semiconductor laser having an active layer of GaInNAs as a light source of a fundamental wave. The semiconductor laser has a GaAs substrate on which AlGaAs layers are grown as clad layers of the p-side and n-side, and a GaInNAs is grown as a quantum well layer, and a GaAs is grown as a light-guiding layer. A pair of $In_x$ and $N_y$ composition of $Ga_{1-x}In_xN_yAs_{1-y}$ contributes to oscillate a light in the range of 1000 to 1300 nm and therefore a second harmonic in the range of 500 to 650 nm thereof. In other words, this semiconductor laser can generate laser light in a wide range of wavelengths from bluish green to red. In the fourth embodiment, a GaInNAs semiconductor laser that has been limited so as to oscillate a light with a wavelength of 1160 nm is fabricated, and a wavelength-converting element having a KTP substrate with a periodically domain-inverted structure as an oscillation element and an optical waveguide is used. A fundamental wave is fed to the wavelength-converting element to produce the yellow second harmonic with a wavelength centered at 580 nm. A laser-driving power supply supplies a bias current to the semiconductor laser in advance and then superposes a pulse current to the bias current in accordance with a signal, so that the oscillation wavelength reaches a wavelength of 1160 nm in a pulse-like fashion to obtain a second harmonic through the wavelength-converting element. Varying the pulse width the a modulating signal will produce a pulse-width modulated second harmonic output. Thus, the fourth embodiment allows making a miniaturized yellow laser light source capable of being modulated. GaAsSb may also be implemented as the active layer instead of GaInNAs, whereby a laser beam with a fundamental wavelength in a similar range can be obtained. Accordingly, modulated harmonics in the range of bluish green to red can be obtained.

Fifth Embodiment

Figure 5A:
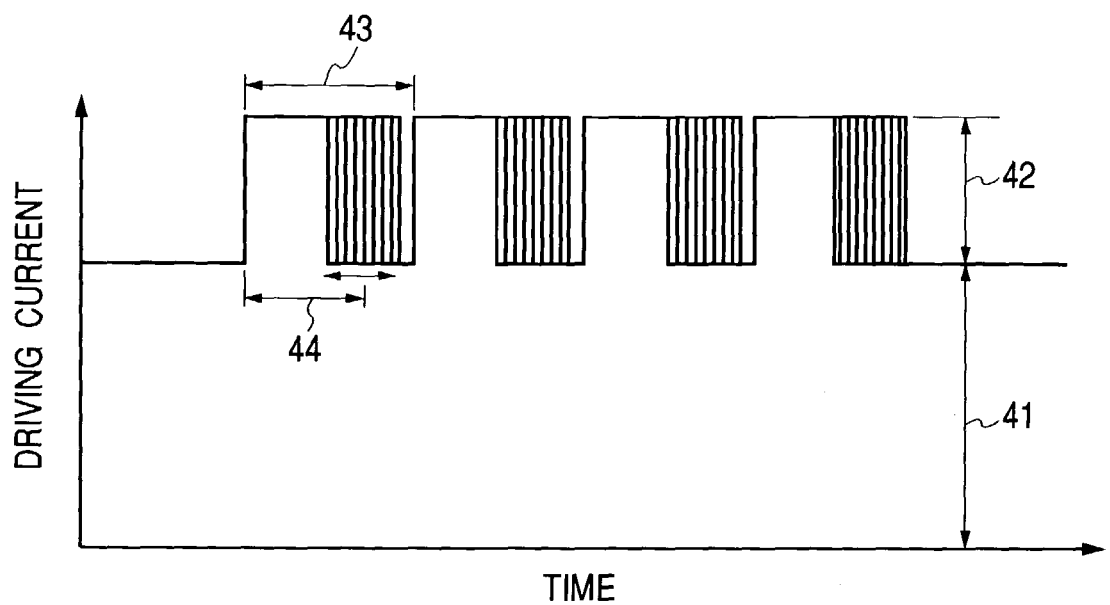
FIGS. 5A and 5B illustrate pulse width modulation according to the embodiment of the invention.
Figure 5B:
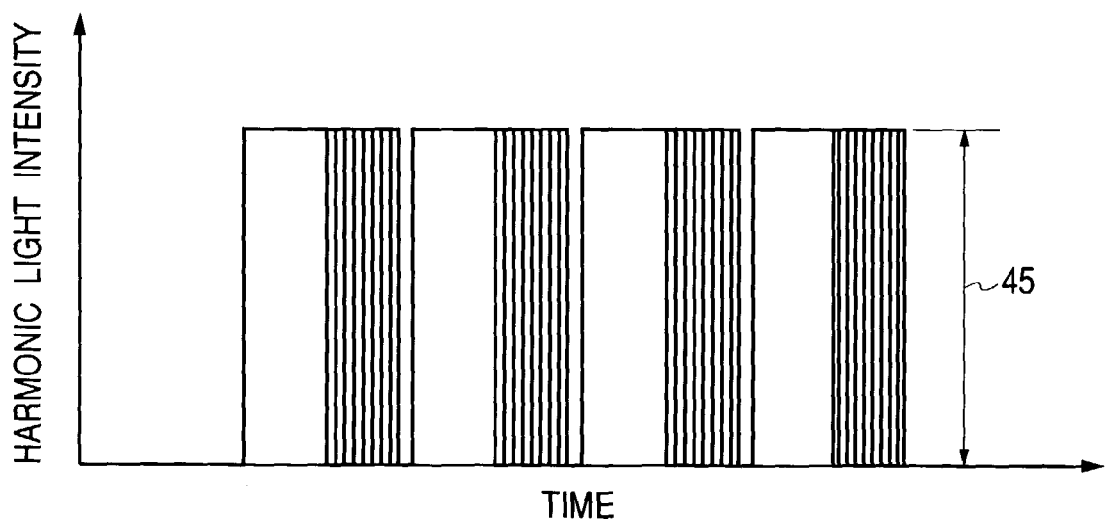
Figure 6:
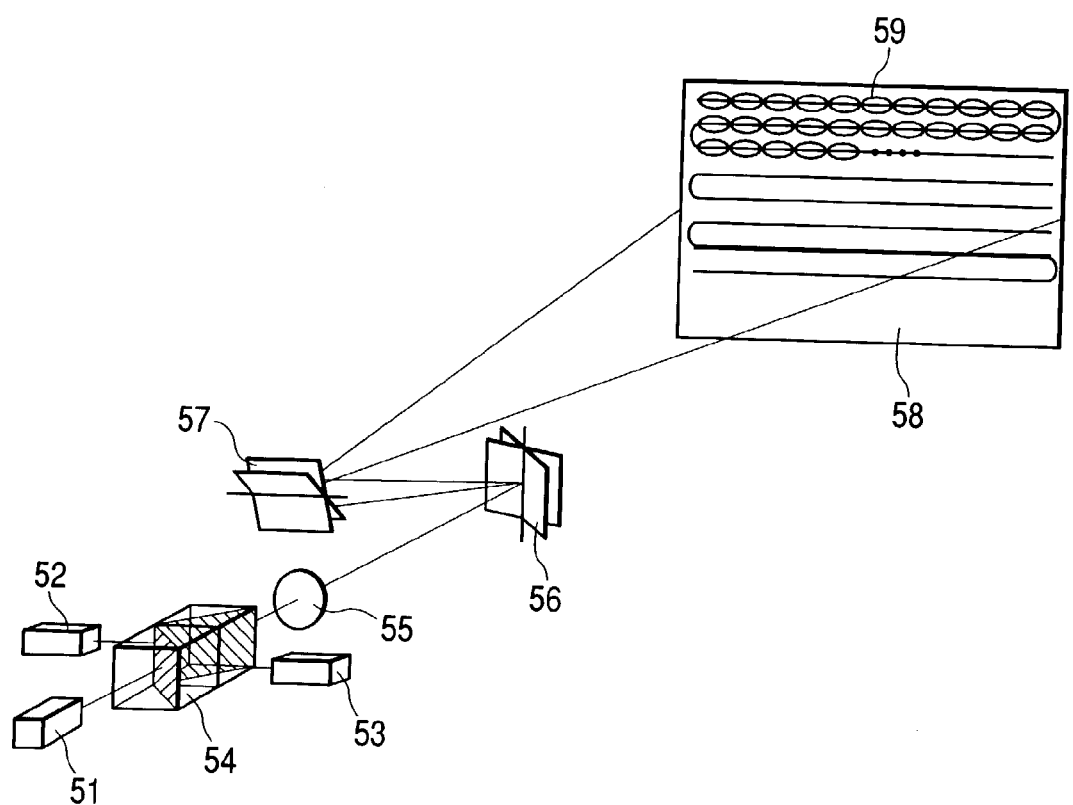
FIG. 6 illustrates an image displaying apparatus according to the embodiment of the invention.

An image displaying apparatus that employs a harmonic generator according to the present invention will be described with reference to FIGS. 5A and 5B and FIG. 6. FIGS. 5A and 5B illustrate pulse modulation according to a fifth embodiment. FIG. 6 illustrates the image displaying apparatus according to the fifth embodiment. Reference numerals 41, 42, 43, and 44 denote a bias current, a modulating current, a clock period, and a pulse width, respectively. Reference numerals 45, 51, 52, 53 and 54 denote a pulse height, three light sources, and a combiner, respectively. Reference numerals 55, 56 and 57, 58, and 59 are a projection lens, light deflectors, a screen onto which the light is projected, and spots that constitute an image, respectively. A semiconductor laser providing a wavelength 1060 nm is used as a light source for generating a fundamental wave, and a wavelength-converting element is in the form of a $KNbO_3$ crystal substrate having a periodically domain-inverted structure and an optical waveguide. By using the semiconductor laser and the wavelength-converting element, a harmonic generator for green light with a wavelength of 530 nm is implemented. In order to obtain the green light of a maximum power of 100 mW, the light source is designed to output a maximum power of 1W at a wavelength of 1060 nm. When bias current 41 is supplied to the semiconductor laser, laser light with an oscillation wavelength of 1056 nm is generated. When modulating current 42 is superposed to bias current 41, laser light with a peak output of 1W with an oscillation wavelength of 1060 nm is generated. The modulating current 42 to be superposed has the pulse width 44 and the clock period 43, the pulse width 44 being modulated by a driving power supply. The waveform of the semiconductor laser output on time axis follows the waveform of the aforementioned driving current (FIG. 5A). As a result of introducing the output of the semiconductor laser to the wavelength-converting element, the harmonic light pulse 45 having a high extinction ratio can be obtained as shown in FIG. 5B. Pulse-width modulation allows control of the green intensity of the respective pixels. The clock period of about 35 nsec is required, assuming that a projection type image displaying apparatus schematically shown in FIG. 6 is an SVGA screen (800×600 pixels) with a frame rate of 60 Hz. In order to perform sufficient modulation within the clock period, a response time of about 1 nsec or less is required. The present invention readily meets this requirement. For a blue light source, an AlGaAs semiconductor laser providing a wavelength of 890 nm is used to generate a second harmonic output having a wavelength of 445 nm with the aid of an LN crystal. Alternatively, an InGaN semiconductor laser may be subjected directly to current modulation to obtain a pulsed output having a wavelength of 445 nm. The blue output power is 80 mW and therefore has a short response time similar to that in the green light source. As for red, an InGaAlP semiconductor laser is used to directly generate a light with a wavelength of 635 nm. The maximum output power is 100 mW. Alternatively, the harmonic generator according to the invention may employ the second harmonics of semiconductor lasers such as GaInNAs, InGaAsP, and InAlGaAs that oscillate at a wavelength of about 1300 nm. As shown in FIG. 6, the outputs of the aforementioned blue, green, and red light sources 51, 52, and 53 are combined by the combiner 54 in the form of a multi layer interference film, and then the combined light is made to pass through the projection lens 55, followed by being incident on the optical deflector 56 and 57 comprised of a micro resonance mirror formed on an Si substrate. The micro resonance mirror may be used for both vertical deflection and horizontal deflection. Alternatively, the resonance mirror may be used only for horizontal deflection, in which case the optical deflector for vertical deflection may take the form of a galvanometer mirror mounted to a micro motor since vertical deflection is performed at a low speed. The laser lights are projected onto screen 58 to form pixels 59 on the screen 58, the pulse widths of the laser lights for their respective colors are controlled on a pixel-by-pixel basis in accordance with the gradation of each pixel. Each colored light emitted from a corresponding light source is subjected to loss when the light passes through scanning and projection systems including the light deflectors. Moreover, non-linearly scanned areas of the light deflectors are cut off, so that overall light utilization efficiency of the image displaying apparatus is in the range of 25 to 50%. For example, for the light utilization efficiency of 50%, the maximum light power projected onto the screen is 50 mW for green and red, and 40 mW for blue. The respective colored light has a power and a center wavelength such that the combined light is the standard $D_{65}$ white light when all of the three color light sources are turned on.

Sixth Embodiment

Figure 7:
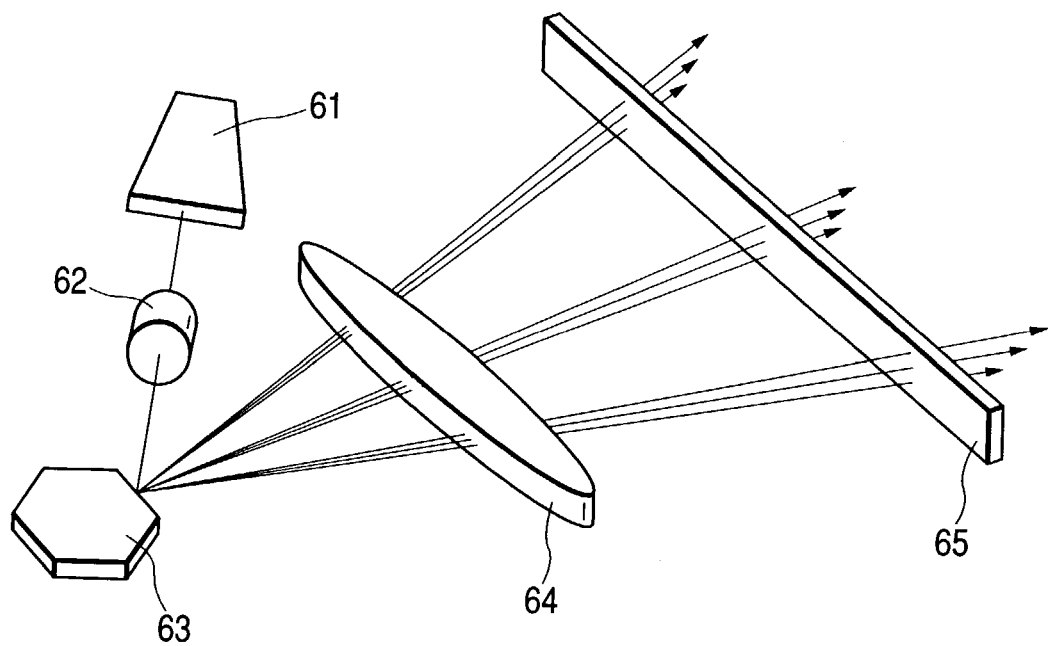
FIG. 7 illustrates an image forming apparatus according to the embodiment of the invention.
Figure 8A:
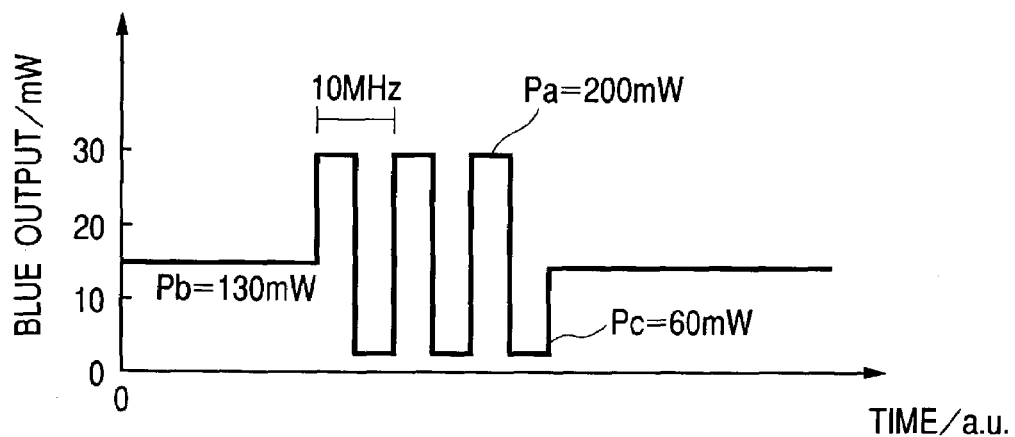
FIGS. 8A and 8B illustrate a conventional apparatus.
Figure 8B:
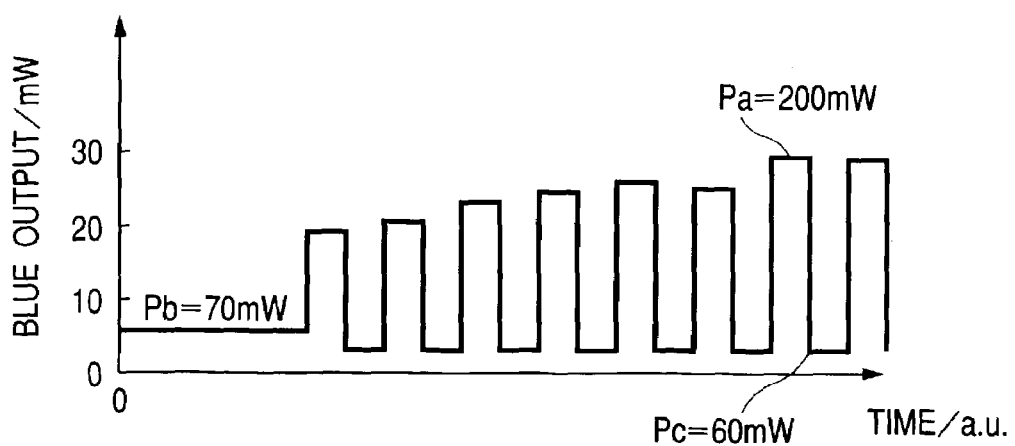

A sixth embodiment is directed a case where a harmonic generator applied to an image forming apparatus in the form of a laser beam printer. FIG. 7 is a schematic view of an image forming apparatus according to the sixth embodiment. Reference numerals 61, 62, and 63 denote a light source, a collimator lens, and an optical deflector, respectively. Reference numerals 64 and 65 denote a coupling lens and an image-forming surface on which an image is formed, respectively. The sixth embodiment uses an InGaAs strained quantum well laser providing a wavelength 980 nm as a light source for generating a fundamental wave, and a wavelength-converting element comprised of an LN substrate having a periodically domain-inverted structure and an optical waveguide, like in the third embodiment. The InGaAs semiconductor laser has a peak power of 30 mW, to obtain a peak harmonic output of 5 mW through the LN wavelength-converting element. The harmonic output has a wavelength of 490 nm. A combination of a bias current and a modulating current can achieve a modulation frequency of 1 GHz and the harmonic output within 1 ns at both leading and trailing. The light emitted from the light source 61 transmits through collimator lens 62, and optical deflector 63 in the form of a polygon rotating mirror deflects the light beam to scan. The light then transmits through imaging forming lens 64, which in turn focuses an image on the image forming surface 65. According to the present embodiment, a train of laser spots having a short wavelength can be formed at high speed, so that an electrostatic latent image is formed on the image-forming surface with high resolution. This allows a high resolution print to be achieved in an electrophotography system. Likewise, the harmonic generator according to the invention can be used as a light source for writing data into and reading data from an optical disk memory. Just as in the present embodiment, the feature that the high speed modulation is possible may be applied to an optical recording apparatus for high speed data writing and high speed data reading.

As described above by way of embodiments, non-linear optical materials for the wavelength-converting element according to the present invention include not only non-linear ferroelectric crystals such as $KTiOPO_4$(KTP), $LiNbO_3$(LN), $KNbO_3$(KN), $LiTaO_3$(LT), $LiB_3O_5$(LBO), and $\beta$-$BaB_2O_2$(BBO), but also organic non-linear material such as 2-adamantylamino-5-nitropyridine(AANP) and 2-methyl-4-nitroaniline(MNA), and non-linear glass materials the surface of which is polarized by applying a strong electric field to the glass material.

The semiconductor lasers used in the present invention include a Fabry-Perot laser that uses an etched mirror or a cleaned mirror of semiconductor laser substrate, a distributed Bragg reflection (DBR) laser, a distributed feedback (DFB) laser, or a surface-emitting laser having a resonator oriented perpendicular to a substrate. The oscillation wavelength of the semiconductor laser depends on the longitudinal mode of oscillation. For single mode oscillation, the semiconductor laser oscillates with a narrow range of spectrum. For multi-mode oscillation, the semiconductor laser oscillates with a relatively wide range of spectrum. The semiconductor laser should be designed such that the spectrum width does not overlap the wavelength tolerance of phase-matching when no harmonic output is generated.

It goes without saying that the modulating signal for modulating the semiconductor laser is not limited to pulses but may be arbitrary waveforms such as sinusoidal, triangular, and saw tooth waves.

As describe above, according to the present invention, high power laser light can be modulated at high speed. Especially, the present invention has a feature that laser pulses having a high extinction ratio (e.g., pulses is lead from zero value) can be generated. Thus, the invention offers very high extinction ratio and contrast ratio in the applications to various image displaying apparatus, image forming apparatus, optical recording apparatus, and instrumentation apparatus. Further, the present invention provides a laser light that can controllably modulated in the wavelength range of bluish green, green, yellowish green, yellow and orange that cannot be obtained by directly modulating a semiconductor laser. Thus, the present invention provides very useful light sources for an image displaying apparatus, an image forming apparatus, an optical recording apparatus and an instrumentation apparatus that require various light wavelengths.

What is claimed is:

1. A method for driving a harmonic generator in which an output light of a semiconductor laser is incident on a wavelength-converting element comprised of a non-linear optical material to generate a harmonic, comprising the steps of:

supplying to the semiconductor laser a driving current comprised of a bias current and a modulating current superposed on the bias current so that the output light of the semiconductor laser is modulated, wherein an oscillation wavelength of the output light of the semiconductor laser is in an allowable range of phase-matching wavelengths when only the bias current is supplied, and is out of the allowable range when both of the bias current and the modulating current are supplied.

* * * * *

UNITED STATES PATENT AND TRADEMARK OFFICE
CERTIFICATE OF CORRECTION

PATENT NO. : 6,987,785 B2
APPLICATION NO. : 10/404057
DATED : January 17, 2006
INVENTOR(S) : Sakata et al.

It is certified that error appears in the above-identified patent and that said Letters Patent is hereby corrected as shown below:

COVER PAGE:
Item (57), ABSTRACT, line 1, "generates" should read -- that generates a --.

Item (57), ABSTRACT, line 2, "at" should read -- at a --.

Item (57), ABSTRACT, line 5, "On" should read -- One --.

COLUMN 3:
Line 62, "phase matching." should read -- phase-matching. --.

COLUMN 5:
Line 47, "wavelength.)." should read -- wavelength). --; and
Line 55, "second" should read -- a second -- and "third" should read -- a third --.

COLUMN 7:
Line 57, "Anti reflection" should read -- Anti-reflection --.

COLUMN 8:
Line 6, "be" should read -- been --;
Line 9, "multi layer" should read -- multi-layer --;
Line 15, "compressivelly" should read -- compressively --; and
Line 51, "quasi phase matching" should read --quasi-phase-matching --.

COLUMN 9:
Line 2, "quasi phase matching" should read -- quasi-phase-matching --; and
Line 41, "the a" should read -- of a --.

UNITED STATES PATENT AND TRADEMARK OFFICE
CERTIFICATE OF CORRECTION

PATENT NO. : 6,987,785 B2
APPLICATION NO. : 10/404057
DATED : January 17, 2006
INVENTOR(S) : Sakata et al.

It is certified that error appears in the above-identified patent and that said Letters Patent is hereby corrected as shown below:

COLUMN 10:
Line 45, "multi layer" should read -- multi-layer --.

COLUMN 12:
Line 17, "describe" should read -- described --;
Line 20, "is" should read -- are --; and
Line 26, "can" should read -- can be --.

Signed and Sealed this

Twenty-fourth Day of October, 2006

JON W. DUDAS
*Director of the United States Patent and Trademark Office*